United States Patent
Messager

(10) Patent No.: US 7,312,644 B2
(45) Date of Patent: Dec. 25, 2007

(54) POWER FAILURE DETECTION CIRCUIT WITH FAST DROP RESPONSE

(75) Inventor: Philippe Messager, Nauves sur loire (FR)

(73) Assignee: Atmel Nantes SA, Nantes Cedex (FR)

( * ) Notice: Subject to any disclaimer, the term of this patent is extended or adjusted under 35 U.S.C. 154(b) by 0 days.

(21) Appl. No.: 11/302,954

(22) Filed: Dec. 14, 2005

(65) Prior Publication Data

US 2006/0170467 A1    Aug. 3, 2006

(30) Foreign Application Priority Data

Dec. 15, 2004    (FR) .................................. 04 13375

(51) Int. Cl.
*H03L 7/00* (2006.01)
(52) U.S. Cl. ...................... 327/143; 327/198
(58) Field of Classification Search ................ 327/142, 327/143, 198
See application file for complete search history.

(56) References Cited

U.S. PATENT DOCUMENTS

| | | | | |
|---|---|---|---|---|
| 4,461,963 A | * | 7/1984 | Koomen | ...................... 327/143 |
| 5,528,182 A | * | 6/1996 | Yokosawa | ..................... 327/143 |
| 5,696,461 A | * | 12/1997 | Germini | ..................... 327/143 |
| 5,744,990 A | * | 4/1998 | Burstein et al. | ............. 327/143 |
| 5,910,739 A | | 6/1999 | Stanojevic | .................... 327/143 |
| 6,181,173 B1 | * | 1/2001 | Homol et al. | ................ 327/143 |
| 6,515,523 B1 | * | 2/2003 | Bikulcius | ..................... 327/142 |
| 7,187,218 B2 | * | 3/2007 | Gossmann | .................. 327/142 |
| 7,212,046 B2 | * | 5/2007 | Hur | ............................. 327/143 |
| 2004/0066218 A1 | * | 4/2004 | Suzuki | ........................ 327/143 |

* cited by examiner

*Primary Examiner*—Tuan T. Lam
*Assistant Examiner*—William Hernandez
(74) *Attorney, Agent, or Firm*—Westman, Champlin & Kelly

(57) ABSTRACT

A device is provided for resetting an integrated circuit generating a reset signal after a power supply voltage drop to a very low level has been detected. Such a device includes at least one control means, the state of which (conducting or non-conducting) is controlled by a control voltage equal to the difference between the power supply voltage and a predetermined offset voltage, such that if the control voltage is less than or equal to a threshold, the control means authorizes activation of the means for generating a reset signal.

15 Claims, 2 Drawing Sheets

POWER FAILURE DETECTION CIRCUIT WITH FAST DROP RESPONSE

FIELD OF THE DISCLOSURE

The field of the disclosure is the one of integrated electronic circuits and more particularly circuits of the type including electronic components provided with a reset input such as logic gates, flip-flops, memories or microprocessors.

More precisely, the disclosure relates to the generation of a reset signal for such circuits.

BACKGROUND OF THE DISCLOSURE

In order to simplify the description, in the remainder of this document we will limit ourselves to describe the special case of integrated circuits operating at a power supply voltage of 3V. Persons skilled in the art will easily extend this information to any type of voltage intended to supply power to an integrated electronic circuit.

In general, integrated circuits operate at a power supply voltage that is not perfectly stable, which sometimes causes serious damage when the power supply voltage drops to a very low level. For example, an under-powered microprocessor will operate unreliably, and could write corrupted data into a memory or overwrite programs, thus causing a system failure when the power supply voltage comes back to a normal level.

Therefore, it is conventional that an integrated circuit will include a Power Failure Detector (PFD) (also called a reset device in the remainder of the description) that generates a reset signal after detection of a drop in a power supply voltage so as to prevent working of the logic, memories or microprocessors until a sufficient power supply voltage is restored.

FIG. 1 shows a diagram of an example of a conventional power failure detector (PFD) referenced 10.

In the special case of this Figure, a first input 11411 of a differential amplifier 1141 powered by a power supply voltage VCC receives a voltage proportional to the power supply voltage VCC, called the weighted voltage div, and a second input 11412 receives a reference voltage VBGP. The differential amplifier 1141 generates a resultant voltage VDIFF on output 11413 that depends on the result of the comparison of the weighted voltage div and the reference voltage VBGP. The resultant voltage VDIFF is applied directly onto the gate GN1 of the transistor TN1. The transistor TN1, the source SN1 of which is connected to the reference potential VSS, and the drain DN1 of which is connected to a current source 111, is used like a switch 115, such that generation means 12 of a reset signal RST may or may not be activated depending on the value of the resultant voltage VDIFF.

In this solution, the generation means 12 are activated when the 3V power supply voltage VCC drops below a predetermined threshold of 2.4V. Indeed when the power supply voltage VCC is less than 2.4 V, the weighted voltage div, the value of which is equal to half of the power supply voltage VCC, is less than the reference voltage VBGP equal to 1.2 V. Therefore the differential amplifier 1141 generates a resultant voltage VDIFF on output 11413 that is equal to approximately the reference potential VSS, namely 0V, so that the transistor TN1 can be put in a non-conducting state (switch open), in which it directs the current ip2 from the current source 111 to the generation means 12, so as to activate the generation of a reset signal RST.

The power failure detector (PFD) 10 generally cooperates with an auxiliary device (not shown) for activating the means 12 of generating a reset signal RST. This auxiliary activation device (Power On Reset—POR) is typically produced using an RC filter and when the power failure detector (PFD) 10 is powered up, it activates the generation means 12 for a determined time until the power supply voltage VCC has increased to a sufficient level (>1.3V) to enable operation of the differential amplifier 1141.

The differential amplifier 1141 begins to operate as soon as the power supply voltage VCC reaches 1.1 V, at such a voltage this amplifier has a reaction time equal to approximately 50 μs. However, the differential amplifier 1141 cannot make a comparison until the power supply voltage VCC has reach 1.3 V, because no reference voltage VBGP is applied to the second input 11412 of the differential amplifier 1141. The BANDGAP cell 113 does not begin to output the reference voltage VBGP of 1.2 V until the power supply voltage VCC reaches 1.3 V.

This solution according to prior art has the disadvantage that it does not generate a reset signal when the power supply voltage drops to a very low level (power supply voltage less than 2.4V) quickly (in less than 1 μs).

This problem is usually overcome by adding a large capacitance (not shown) of several μF to the above-mentioned detector (PFD) 10. This capacitance is mounted outside the detector (PFD) 10, and slows the drop in the power supply voltage VCC. Thus, this technique enables the detector (PFD) 10 to generate a reset signal when the power supply voltage VCC drops to a level below 2.4 V and before it is too low (<1.3 V) to assure operation of the differential amplifier 1141.

However, this known technique has the disadvantage that it requires an expensive and large volume capacitance because it is not integrated in the printed circuit.

SUMMARY

One purpose of an embodiment of the invention is to provide a new technique for generating a reset signal even when the power supply voltage drops quickly to a very low level (typically less than 1.4 V). Thus, and unlike the conventional PFD detector of the type shown in FIG. 1, the embodiment is capable of generating a reset signal in the case of a sudden disturbance in the power supply voltage, for example if the power supply voltage drops to 0 V in 500 ns, and rises to a sufficient level in a few hundred μs. Theoretically, the embodiment even generates a reset signal for a drop and a rise in the power supply voltage occurring over a duration of 5 ns. Throughout this document, "fast drop" means any voltage drop that is too fast for a reset signal to be generated by a conventional detector (PFD) of the type shown in FIG. 1.

Another purpose of an embodiment of the invention is to propose such a technique adapted to all standard power supply voltages of existing integrated circuits.

Another purpose of an embodiment of the invention is to provide such a technique that does not increase the size of the printed circuit.

Another purpose of an embodiment of the invention is to propose such a technique that is simple and inexpensive to implement.

One embodiment of the invention is directed to a resetting device comprising means for detecting a drop in a power supply voltage received by the device and means for generating a reset signal, activated after the detection means have detected a drop in the power supply voltage.

The detection means comprise at least one control means comprising a control element on which a control voltage is applied directly, equal to the difference between the power supply voltage and a predetermined offset voltage, such that if the control voltage is less than or equal to a threshold, the said at least one control means authorizes activation of the means for generating a reset signal.

Thus, the embodiment is based on a quite innovative and inventive approach for the generation of a reset signal for an integrated circuit. One of the difficulties solved by this or other embodiments is particularly the fact that the control means is capable of detecting a fast drop (for example 500 ns) in a power supply voltage to a very low level (for example 1.3 V) and if necessary of activating means for generating a reset signal and, unlike the above-mentioned technique of prior art, without an expensive and large capacitance.

To achieve this, in one exemplary embodiment, a control means controlled by a control voltage is used which, unlike the above-mentioned known technique (see FIG. 1) is not a voltage generated at the output from a differential amplifier. Consequently, the control voltage is generated more quickly, in the sense that it is not dependent on the reaction time (time to generate a control voltage) (usually longer than 1 µs) of the differential amplifier. Furthermore, the control voltage may be generated even when the power supply voltage is less than a threshold (for example 1.3 V) below which the differential amplifier in the solution of prior art no longer generates any control voltage.

In one embodiment, if the control means can be used externally to the circuit, it is preferably integrated into the circuit. In this case, it is simple to implement and for a low cost.

In a first advantageous embodiment of the invention, the said detection means comprise a first control means itself comprising a first transistor forming a first switch and cooperating with energy storage means included in the said detection means, the said first transistor comprising a control element to which a first control voltage is applied equal to the difference between the said power supply voltage and a first predetermined offset voltage, such that:
  if the said first control voltage is greater than a first threshold, the said first transistor is in a non-conducting state in which the said first transistor authorizes storage of energy in the said storage means;
  if the said first control voltage is less than or equal to the said first threshold, the said first transistor is in a conducting state in which the said first transistor authorizes the said energy storage means to release the said energy, so as to activate the said generation means.

In one example, the said first threshold is equal to the difference between a determined voltage applied to a source of the said first transistor and a threshold voltage of the said first transistor.

Advantageously, the said first predetermined offset voltage, denoted VX1, is such that: $0 \leq VX1 < VCCn-(VS-VT)$
  where
  VCCn is a nominal value of the said power supply voltage;
  VT is a threshold voltage of the said first transistor; and
  VS is a determined voltage applied to a source of the said first transistor.

Preferably, the said energy storage means comprise a second transistor used as a filtering capacitance.

In a second advantageous embodiment of the invention, the said detection means comprise a second control means itself comprising a third transistor forming a second switch and cooperating with a first current source included within the said detection means, the said third transistor comprising a control element on which a second control voltage is applied, which is equal to the difference between the said power supply voltage and a second predetermined offset voltage, such that:
  if the said second control voltage is greater than a second threshold, the said third transistor is in a conducting state, in which the said third transistor prevents a current generated by the said first current source from reaching the said generation means;
  if the said second control voltage is less than or equal to the said second threshold, the said third transistor is in the non-conducting state, in which the said third transistor directs the current generated by the said first current source to the said means for generating a reset signal, so as to activate the said generation means.

Preferably, the said second threshold is equal to a threshold voltage of the said third transistor.

Advantageously, the said second predetermined offset voltage, denoted VX2, is such that: $0 \leq VX2 < VCCn-VT$
  where
  VCCn is a nominal value of the said power supply voltage; and
  VT is a threshold voltage of the said third transistor.

Preferably, the said current source comprises a current mirror powered by the said power supply voltage.

Advantageously, the said third transistor comprises:
  a gate forming the said control element of the third transistor;
  a source connected to the ground;
  a drain connected to a mid-point between the said first current source and the said generation means.

In one embodiment of the invention, the said detection means comprise the said first control means and the said second control means, the said first threshold being less than the said second threshold.

In a third advantageous embodiment of the invention, the said detection means also comprise a third control means, itself comprising:
  means for comparing a voltage proportional to the said power supply voltage with a determined reference voltage, the said comparison means generating a resultant voltage that depends on the result of the comparison;
  a fourth transistor forming a third switch and cooperating with a second current source, that may or may not be coincident with the said first current source, the said fourth transistor comprising a control element on which the said resultant voltage is applied, such that:
  if the said resultant voltage is greater than a third threshold, the said fourth transistor is in a conducting state, in which the said fourth transistor prevents a current generated by the said second current source from reaching the said generation means;
  if the said resultant voltage is less than or equal to the said third threshold, the said fourth transistor is in a non-conducting state, in which the said fourth transistor directs the current generated by the said second current source to the said means for generating a reset signal, so as to activate the said generation means.

Thus, the above-mentioned known technique (see FIG. 1) to which this third control means corresponds, may be used in parallel with the first and/or the second control means according to an embodiment of the invention. In this way, the range of values in which a power supply voltage drop can be detected is increased.

Preferably, the said second threshold is less than the said third threshold.

Advantageously, the said first threshold is less than the said third threshold.

Preferably, the fourth transistor is mounted with respect to the third transistor such that the said second switch formed by the third transistor behaves like a master switch with respect to the third switch formed by the fourth transistor, such that if the third transistor is in the said non-conducting state, the said generation means are activated regardless of the state of the fourth transistor.

Advantageously, the said fourth transistor comprises:
a gate forming the said control element of the fourth transistor;
a source connected to the drain of the third transistor;
a drain connected to the said mid-point.

One or more embodiments also relate to an electronic circuit comprising a resetting device like that described above.

Other characteristics and advantages of one or more embodiments of the invention will become clearer after reading the following description of an embodiment given as a simple illustrative and non-limitative example, and the attached drawings.

DETAILED DESCRIPTION OF ILLUSTRATIVE EMBODIMENTS

The general principle of an embodiment of the invention is based on the use of a control voltage equal to the difference between the power supply voltage and a predetermined offset voltage, to detect a fast drop in the power supply voltage to a low level. This control voltage activates at least one transistor. The transistor may or may not generate a reset signal.

Figure 1:
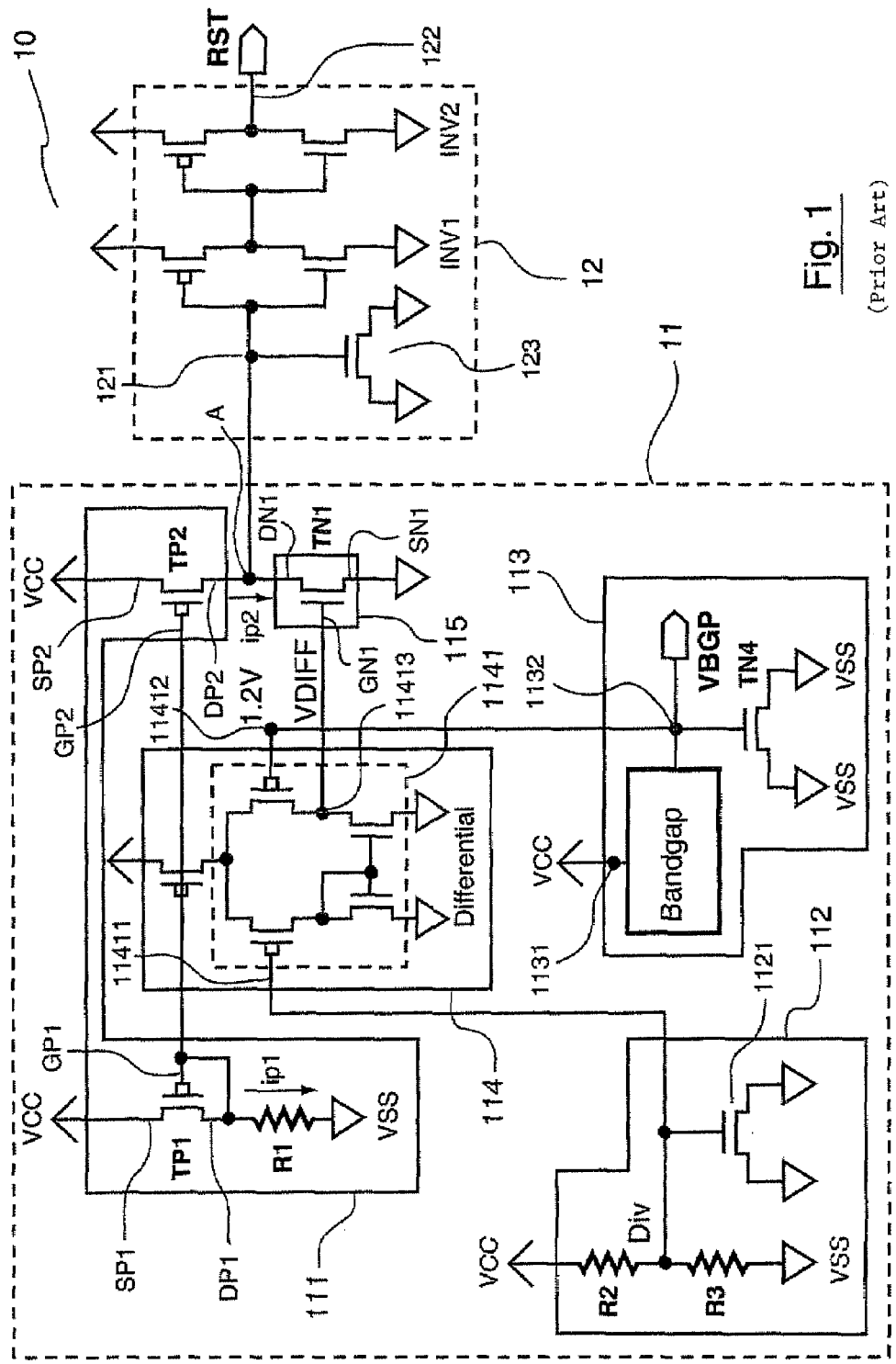
FIG. 1 shows a diagram of a conventional resetting device used to detect a drop in a power supply voltage.

We will now describe an example of a conventional resetting device (or power failure detector (PFD)) 10, comprising detection means 11 and generation means 12, with reference to FIG. 1.

Figure 2:
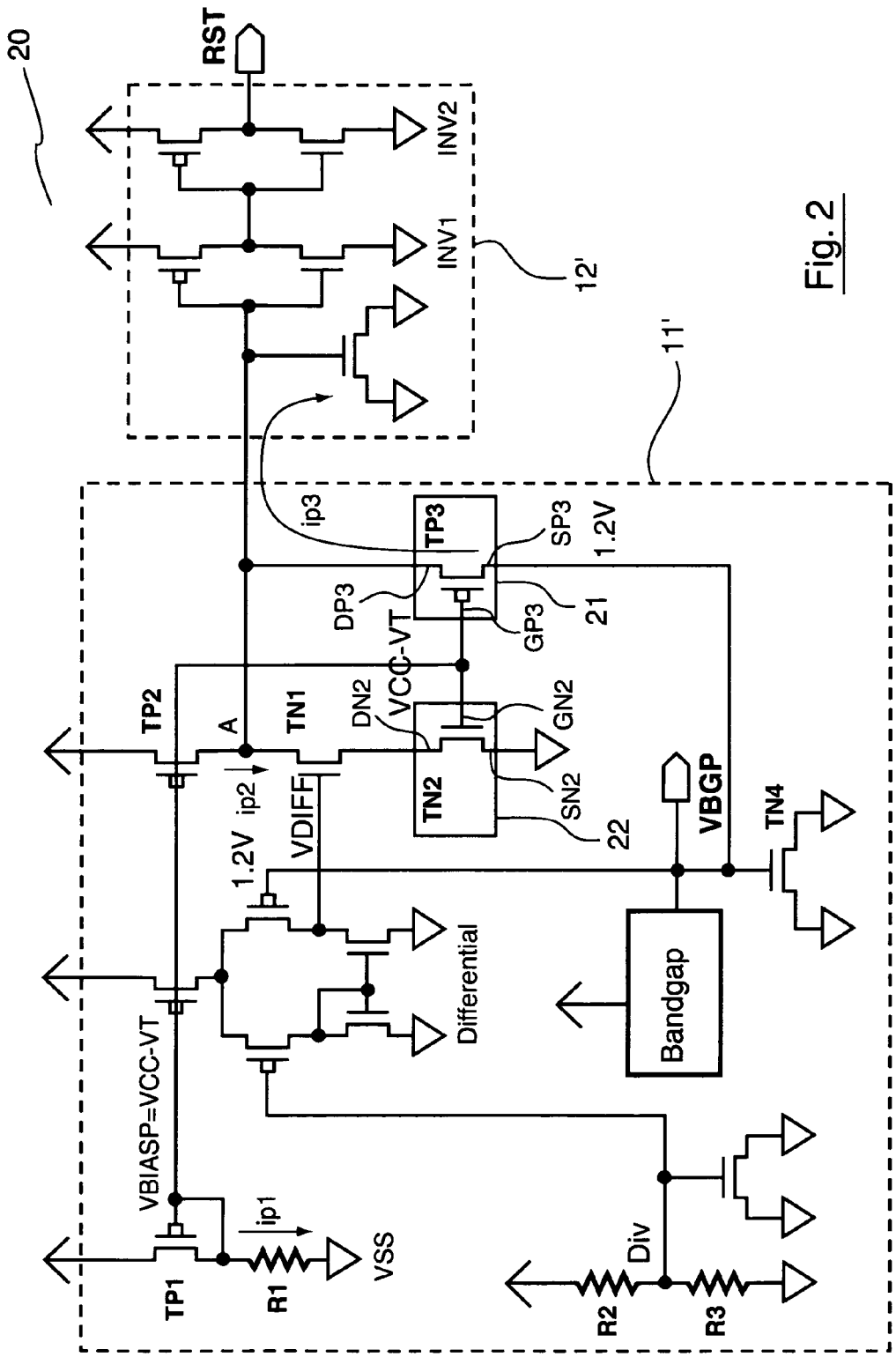
FIG. 2 shows a diagram of the resetting device according to an embodiment of the invention.

As can be seen with reference to FIG. 2, the conventional resetting device 10 may act as a basis for producing a resetting device according to an embodiment of the invention. In this case, some control means specific to an embodiment of the invention, which received a control voltage, equals to the difference between the power supply voltage and a predetermined offset voltage, permit to activate the generation of a reset signal when the power supply voltage drops quickly to a low level.

The detection means 11 include means 114 for comparing a voltage delivered by weighting means 112 with a voltage delivered by a BANDGAP cell 113.

The weighting means 112 output a weighted voltage div that is proportional to the power supply voltage VCC. These weighting means 112 comprise a first and a second weighting resistor R2, R3 with equal values, that are associated in series. The first weighting resistor R2 is connected to the power supply voltage VCC. The second weighting resistor R3 is connected to the reference potential VSS (usually equal to 0 V). The weighted voltage div is the voltage at the terminals of the second weighting resistor R3. Therefore, it is proportional to the power supply voltage VCC according to a proportionality rate equals to the second weighting resistor R3 divided by the sum of the first and second weighting resistors R2, R3 (since the value of the resistance R2 is equal to the value of the resistance R3, the weighted voltage div is equal to half the power supply voltage VCC). The weighting means 112 also include a transistor 1121 installed as a capacitance (the weighted voltage div is applied to the gate, the drain and the source being connected to the reference potential VSS). The function of this capacitance is to filter noise so as to prevent a reset signal from being generated when it is not necessary.

The input 1131 of the BANDGAP cell 113 is powered by the power supply voltage VCC. This cell 113 starts to produce a reference voltage VBGP equal to 1.2 V on the output 1132 as soon as the power supply voltage VCC reaches 1.3 V. A transistor TN4 is mounted in parallel at the output 1132 of the BANDGAP cell 113. This transistor TN4, mounted as a capacitance (the reference voltage VBGP is applied to the gate, the drain and the source being connected to the reference potential VSS), permit to filter noise so as to prevent a reset signal from being generated when it is not necessary.

The comparison means 114 comprise a differential amplifier 1141, powered by the power supply voltage VCC, which a first input 11411 receives the weighted voltage div and a second input 11412 receives the reference voltage VBGP. The output 11413 (on the side of the second input) of the amplifier 1141 outputs a resultant voltage VDIFF that is applied to the gate GN1 of the transistor TN1, such that the differential amplifier 1141 controls the state (conducting or non-conducting) of the transistor TN1 as well as the current ip2 passing through it in the conducting state.

The transistor TN1, the source SN1 of which is connected to the reference potential VSS and the drain DN1 of which is connected to a mid-point A, forms a switch 115.

If the transistor TN1 is made conducting by the resultant voltage VDIFF (for this purpose equals to the power supply voltage VCC), then the potential of the mid-point A is approximately equals to the reference potential VSS, namely 0 V. Thus, the means 12 for generating the reset signal RST are not activated. The resultant voltage VDIFF is equal to the power supply voltage VCC when the weighted voltage div is greater than the reference voltage VBGP (of 1.2V), in other words when the power supply voltage VCC is greater than 2.4 V.

If the transistor TN1 is made non-conducting by the resultant voltage VDIFF (for this purpose equals to the reference potential VSS), then the current ip2 of the current source 111 charges the potential of the mid-point A, such that it becomes non-zero and positive. Thus, the means 12 for generating the reset signal RST are activated. The resultant voltage VDIFF is equal to the reference potential VSS when the weighted voltage div is less than the reference voltage VBGP (of 1.2V), in other words when the power supply voltage VCC is less than or equal to 2.4V.

The detection means 11 also comprise a current source 111 itself comprising a first transistor TP1 mounted as a diode (the gate GP1 is connected to the drain DP1). The power supply voltage VCC is applied on the source SP1 of the first transistor TP1. The drain DP1 of this transistor is connected to a resistance R1 that is itself connected to the reference potential VSS. The value of the current intensity ip1 circulating in the first transistor TP1 is imposed by the value of the resistance R1. The gate GP1 of the first transistor TP1 is connected to the gate GP2 of the second transistor TP2. The first and second transistors form a current mirror, according to which the current ip1 circulating on the drain DP1 of the first transistor TP1 is equal to the current ip2 circulating on the drain DP2 of the second transistor TP2. The power supply voltage VCC is applied on the source SP2 of the second transistor TP2. The drain DP2 of the second transistor TP2 is connected to the mid-point A.

Thus, the mid-point A is a connection point common to the drain DP2 of the transistor TP2, to the drain DN1 of the transistor TN1, and to the input 121 of the generation means 12.

The generation means 12 are activated when the mid-point A is charged (non-zero and positive potential). These generation means 12 include a first and a second inverter INV1, INV2 (each based on two transistors) mounted in series. This basic installation enables in one hand to form a reset signal delivered at the output 122 and in the other hand to increase the load factor (Fan-Out). The generation means 12 also comprise a transistor 123 installed in parallel at the input 121 of these means 12. This transistor 123, installed as a capacitance (the gate being connected to the mid-point A, the drain and the source being connected to the reference potential VSS), permits to filter noise so as to prevent a reset signal from being generated when it is not necessary.

We will now describe a resetting device 20 according to an embodiment of the invention, with reference to FIG. 2.

In this embodiment, the resetting device 20:

detection means 11', comprising first and second control means specific to an embodiment of the invention, together with the detection means 11 described with reference to FIG. 1; and generation means 12' identical to the generation means 12 described with reference to FIG. 1.

All elements in FIG. 1 keep the same reference when they appear in FIG. 2.

The first control means 21 include a transistor TP3 directly receiving on its gate GP3 a first control voltage VBIASP (VBIASP is delivered by the gate GP1 of the transistor TP1), equals to the difference between the power supply voltage VCC and a first offset voltage VX1. In this preferred embodiment, the first offset voltage VX1 is the threshold voltage VTP1 of the equivalent diode of the transistor TP1. This voltage VBIASP controls the state (conducting or non-conducting) of the transistor TP3, the drain DP3 of which is connected to the mid-point A and the source SP3 of which is connected to the output 1132 of the BANDGAP cell 113 (outputting the voltage VBGP).

In this preferred embodiment, the transistor TP3 is a MOS transistor of the P type with a threshold voltage VTP3 (usually −0.7 V) (not shown).

Thus, to put the transistor TP3 into a non-conducting state, the switching voltage VGS (not shown), equals to the difference between the voltage (VBIASP) applied on the gate GP3 of the transistor TP3 and the voltage (VBGP) applied on the source SP3 of the transistor TP3, must be greater than the threshold voltage VTP3 of the transistor TP3. Consequently, the transistor TP3 is made non-conducting by the first control voltage VBIASP when VBIASP is greater than a first threshold, equals to the sum of the reference voltage VBGP (for example 1.2 V) and the threshold voltage VTP3 (for example −0.7 V) of the transistor TP3, namely for example 0.5V. In other words, the transistor TP3 is made non-conducting when the power supply voltage VCC is greater than a second threshold, equals to the sum of three voltages that are respectively the first offset voltage VX1 (for example 0.7 V), the reference voltage VBGP (for example 1.2 V) and the threshold voltage VTP3 (for example −0.7 V) of the transistor TP3, namely for example 1.2 V.

Conversely, the transistor TP3 is made conducting by the first control voltage VBIASP when this voltage is less than or equal to the first threshold described above (for example 0.5 V). In other words, the transistor TP3 is made conducting when the power supply voltage VCC is less than or equal to the second threshold described above (for example 1.2 V).

It should be noted that the first offset voltage VX1 is such that:

$$0 \leq VX1 < VCCn - (VS - VTP3)$$

where

VCCn is a nominal value (for example 3 V) of the power supply voltage VCC;

VTP3 is the threshold voltage (for example −0.7 V) of the transistor TP3; and

VS is the voltage applied on the source SP3 of the transistor TP3 (in this embodiment, VS is the reference voltage VBGP (for example 1.2V)).

If the transistor TP3 is made non-conducting by the control voltage VBIASP (VBIASP greater than 0.5 V), then the capacitance equivalent to transistor TN4 (mounted in parallel at the output 1132 of the cell 113) is charged with the reference voltage VBGP (for example 1.2 V).

If the transistor TP3 is made conducting by the control voltage VBIASP (VBIASP is less than or equal to 0.5 V), then the current ip3 of the capacitance equivalent to the transistor TN4 charges the potential of the mid-point A, such that the mid-point becomes non-null and positive. Thus, the means 12 for generating the reset signal RST are activated.

These first control means 21 permit to activate the generation of a reset signal RST when the power supply voltage VCC is less than or equal to 1.2 V (even if VCC is equals to 0 V).

The second control means 22 comprise a transistor TN2 directly receiving on its gate GP2 a second control voltage VBIASP (VBIASP is outputed by the gate GP1 of the transistor TP1), equals to the difference between the power supply voltage VCC and a second offset voltage VX2. In this preferred embodiment, the second offset voltage VX2 is the threshold voltage VTP1 of the equivalent diode of the transistor TP1. This voltage VBIASP permits to control the state (conducting or non-conducting) of the transistor TN2, the source SN2 of which is connected to the reference potential VSS and the drain DN2 of which is connected to the source SN1 of the transistor TN1.

In this preferred embodiment, the transistor TN2 is a MOS transistor of the N type with a threshold voltage VTN2 (usually +0.7 V) (not shown).

Thus, to put the transistor TN2 into a conducting state the switching voltage VGS (not shown) equals to the difference between the voltage (VBIASP) applied on the gate GN2 of the transistor TN2 and the voltage (VSS) applied on the source SN2 of the transistor TN2 must be greater than the threshold voltage VTN2 of the transistor TN2. Consequently, the transistor TN2 is made conducting by the second control voltage VBIASP when this control voltage is greater than a third threshold, equals to the sum of the reference potential VSS (for example 0 V) and the threshold voltage VTN2 (for example +0.7 V) of the transistor TN2, namely for example 0.7 V. In other words, the transistor TN2 is made conducting when the power supply voltage VCC is greater than a fourth threshold, equals to the sum of three voltages that are respectively the second offset voltage VX2

(for example 0.7 V), the reference potential VSS (for example 0 V) and the threshold voltage VTN2 (for example +0.7 V) of the transistor TN2, namely for example 1.4 V.

Conversely, the transistor TN2 is made non-conducting by the second control voltage VBIASP when this voltage is less than or equal to the third threshold described above (for example 0.7 V). In other words, the transistor TN2 is made non-conducting when the power supply voltage VCC is less than or equal to the fourth threshold described above (for example 1.4 V).

It should be noted that the second offset voltage VX2 is such that:

$$0 \leq VX2 < VCCn - VTN2$$

where

VCCn is a nominal value (for example 3V) of the power supply voltage VCC;

VTN2 is the threshold voltage (for example +0.7 V) of the transistor TN2.

If the transistor TN2 is made conducting by the control voltage VBIASP (VBIASP greater than 0.7V), then the state (conducting or non-conducting) of the transistor TN1 enables or not the activation of the means 12 for generating the reset signal RST as described with reference to FIG. 1.

If the transistor TN2 is made non-conducting by the control voltage VBIASP (VBIASP is less than or equal to 0.7 V), then regardless of the state of the transistor TN1, the current ip2 of the current source 111 charges the potential of the mid-point A, such that it becomes non-zero and positive. Thus, the means 12 for generating the reset signal RST are activated.

These second control means 22 permit to activate the generation of a reset signal RST when the power supply voltage VCC is less than or equal to 1.4 V.

In summary, the resetting device for an integrated circuit based on detection of a power supply voltage drop as proposed by an embodiment of the invention can have, but is not required to have, many advantages, some of which are included in the following non-exhaustive list:

improved detection speed, since an embodiment of the invention is capable of detecting a power supply voltage drop to a low level in less than 1 µs;

improved detection rate, since an embodiment of the invention is capable of detecting a power supply voltage drop over a wider range of values.

Obviously, the invention is not limited to the embodiments mentioned above.

For example, depending on the required detection rate, a person skilled in the art could use the first and second control means alone or in combination.

Similarly, the control voltage of the control means may be made in any other way, particularly using a Wheatstone bridge.

In general, in other embodiments, the values VCCn, VTP3, VTN2, VTP1 and VBGP may be different from the values given in the case of the preferred embodiment described above.

Although the disclosure has been described above with reference to a limited number of embodiments, in reading this description, a person skilled in the art will understand that other embodiments could be imagined without going outside the scope of this invention. Consequently, the scope of the invention is only limited by the attached claims.

The invention claimed is:

1. A resetting device comprising:

detection means for detecting a drop in a power supply voltage received by the said device; and means for generating a reset signal, activated after a drop in the said power supply voltage has been detected by the said detection means, wherein the said detection means comprise:

a first control means itself comprising a first transistor forming a first switch and cooperating with energy storing means included within the said detection means, the said first transistor comprising a control element on which a first control voltage is applied, which is equal to the difference between the said power supply voltage and a first predetermined offset voltage, such that:

if the said first control voltage is greater than a first threshold, the said first transistor is in a non-conducting state, in which the said first transistor authorizes storage of energy in the said storage means; and if the said first control voltage is less than or equal to the said first threshold, the said first transistor is in a conducting state in which the said first transistor authorizes the said energy storage means to release the said energy, so as to activate the said generation means;

a second control means itself comprising a second transistor forming a second switch and cooperating with a first current source included within the said detection means, the said second transistor comprising a control element on which a second control voltage is applied, which is equal to the difference between the said power supply voltage and a second predetermined offset voltage, such that:

if the said second control voltage is greater than a second threshold, the said second transistor is in a conducting state, in which the said second transistor prevents a current generated by the said first current source from reaching the said generation means; and if the said second control voltage is less than or equal to the said second threshold, the said second transistor is in a non-conducting state, in which the said second transistor directs the current generated by the said first current source to the said means for generating a reset signal, so as to activate the said generation means.

2. The resetting device according to claim 1, wherein the said first threshold is equal to the difference between a determined voltage applied to a source of the said first transistor and a threshold voltage of the said first transistor.

3. The resetting device according to claim 1, wherein the said first predetermined offset voltage, denoted VX1, is such that: $0 \leq VX1 < VCCn - (VS-VT)$ where VCCn is a nominal value of the said power supply voltage;

VT is a threshold voltage of the said first transistor; and

VS is a determined voltage applied to a source of the said first transistor.

4. The resetting device according to claim 1, wherein the said energy storage means comprise a third transistor used as a filtering capacitance.

5. The resetting device according to claim 1, wherein the said second threshold is equal to a threshold voltage of the said second transistor.

6. The resetting device according to claim 1, wherein the said second predetermined offset voltage, denoted VX2, is such that:

$$0 \leq VX2 < VCCn - VT,$$

where:

VCCn is a nominal value of the said power supply voltage; and

VT is a threshold voltage of the said second transistor.

7. The resetting device according to claim 1, wherein the said first current source comprises a current mirror powered by the said power supply voltage.

8. The resetting device according to claim 1, wherein the said second transistor comprises:
- a gate forming the said control element of the second transistor;
- a source connected to the ground; and
- a drain connected to a mid-point between the said first current source and the said generation means.

9. The resetting device according to claim 1, wherein the said first threshold is less than the said second threshold.

10. The resetting device according to any one of claims 1, wherein the said detection means also comprise a third control means, itself comprising:
- means for comparing a voltage proportional to the said power supply voltage (div) with a determined reference voltage (VBGP), the said comparison means generating a resultant voltage (VDIFF) that depends on the result of the comparison;
- a fourth transistor forming a third switch and cooperating with a second current source, that may or may not be coincident with the said first current source, the said fourth transistor comprising a control element on which the said resultant voltage is applied, such that:
  - if the said resultant voltage (VDIFF) is greater than a third threshold, the said fourth transistor is in a conducting state, in which the said fourth transistor prevents a current generated by the said second current source from reaching the said generation means;
  - if the said resultant voltage (VDIFF) is less than or equal to the said third threshold, the said fourth transistor is in a non-conducting state, in which the said fourth transistor directs the current generated by the said second current source to the said means for generating a reset signal, so as to activate the said generation means.

11. The resetting device according to claim 10, wherein the said second threshold is less than the said third threshold.

12. The resetting device according to claim 10, wherein the said first threshold is less than the said third threshold.

13. The resetting device according to claim 10, wherein the fourth transistor is mounted with respect to the second transistor such that the said second switch formed by the second transistor behaves like a master switch with respect to the third switch formed by the fourth transistor, such that if the second transistor is in the said non-conducting state, the said generation means are activated regardless of the state of the fourth transistor.

14. The resetting device according to any one of claims 10, wherein the said fourth transistor comprises:
- a gate forming the said control element of the fourth transistor;
- a source connected to the drain of the second transistor; and
- a drain connected to a mid-point between the said first current source and the said generation means.

15. An electronic circuit comprising the resetting device of claim 1.

* * * * *